(12) United States Patent
Maeda et al.

(10) Patent No.: US 12,199,207 B2
(45) Date of Patent: Jan. 14, 2025

(54) SOLAR CELL MODULE

(71) Applicant: KANEKA CORPORATION, Osaka (JP)

(72) Inventors: Kengo Maeda, Osaka (JP); Hideki Matsuo, Osaka (JP)

(73) Assignee: KANEKA CORPORATION, Osaka (JP)

( * ) Notice: Subject to any disclaimer, the term of this patent is extended or adjusted under 35 U.S.C. 154(b) by 28 days.

(21) Appl. No.: 17/995,549

(22) PCT Filed: Apr. 8, 2021

(86) PCT No.: PCT/JP2021/014868
§ 371 (c)(1),
(2) Date: Oct. 5, 2022

(87) PCT Pub. No.: WO2021/206135
PCT Pub. Date: Oct. 14, 2021

(65) Prior Publication Data
US 2023/0155045 A1 May 18, 2023

(30) Foreign Application Priority Data

Apr. 9, 2020 (JP) ................. 2020-070450

(51) Int. Cl.
*H01L 31/05* (2014.01)
*H01L 31/048* (2014.01)
(52) U.S. Cl.
CPC ...... *H01L 31/0508* (2013.01); *H01L 31/0488* (2013.01); *H01L 31/0512* (2013.01)
(58) Field of Classification Search
CPC ............. H01L 31/0508; H01L 31/0488; H01L 31/0512; H01L 31/0504; H02S 40/34; Y02E 10/50
See application file for complete search history.

(56) References Cited

U.S. PATENT DOCUMENTS

2009/0065043 A1* 3/2009 Hadorn ................ H05K 3/3468
136/244
2017/0012576 A1* 1/2017 Inaba ...................... H02S 40/34
(Continued)

FOREIGN PATENT DOCUMENTS

JP 2009-527917 A 7/2009
JP 2017-502525 A 1/2017
(Continued)

OTHER PUBLICATIONS

International Search Report issued in PCT/JP2021/014868; mailed Jun. 15, 2021.
(Continued)

*Primary Examiner* — Angelo Trivisonno
(74) *Attorney, Agent, or Firm* — Studebaker & Brackett PC

(57) ABSTRACT

Each of at least three solar cell strings has a first end and a second end in a first direction each including a connector. At the first end and the second end, a wire member is provided to which the connector of the first end of each of at least two solar cell strings out of the at least three solar cell strings and the connector of the second end thereof are connected. A first sheet member is provided to allow the wire member at the first end to be located in a specific positional relationship with the wire member at the second end, and a second sheet member is provided to allow the wire member at the second end to be located in a specific positional relationship with the wire member at the first end.

6 Claims, 9 Drawing Sheets

(56) References Cited

U.S. PATENT DOCUMENTS

2017/0278992 A1   9/2017  Kouyanagi et al.
2018/0323333 A1*  11/2018  Morad ................. H01L 31/044
2019/0319144 A1   10/2019  Lin et al.

FOREIGN PATENT DOCUMENTS

WO    2015/106167 A2   7/2015
WO    2016/047029 A1   3/2016
WO    2019/172258 A1   9/2019

OTHER PUBLICATIONS

International Preliminary Report On Patentability and Written Opinion issued in PCT/JP2021/014868; mailed Oct. 20, 2022.

* cited by examiner

Fig.1
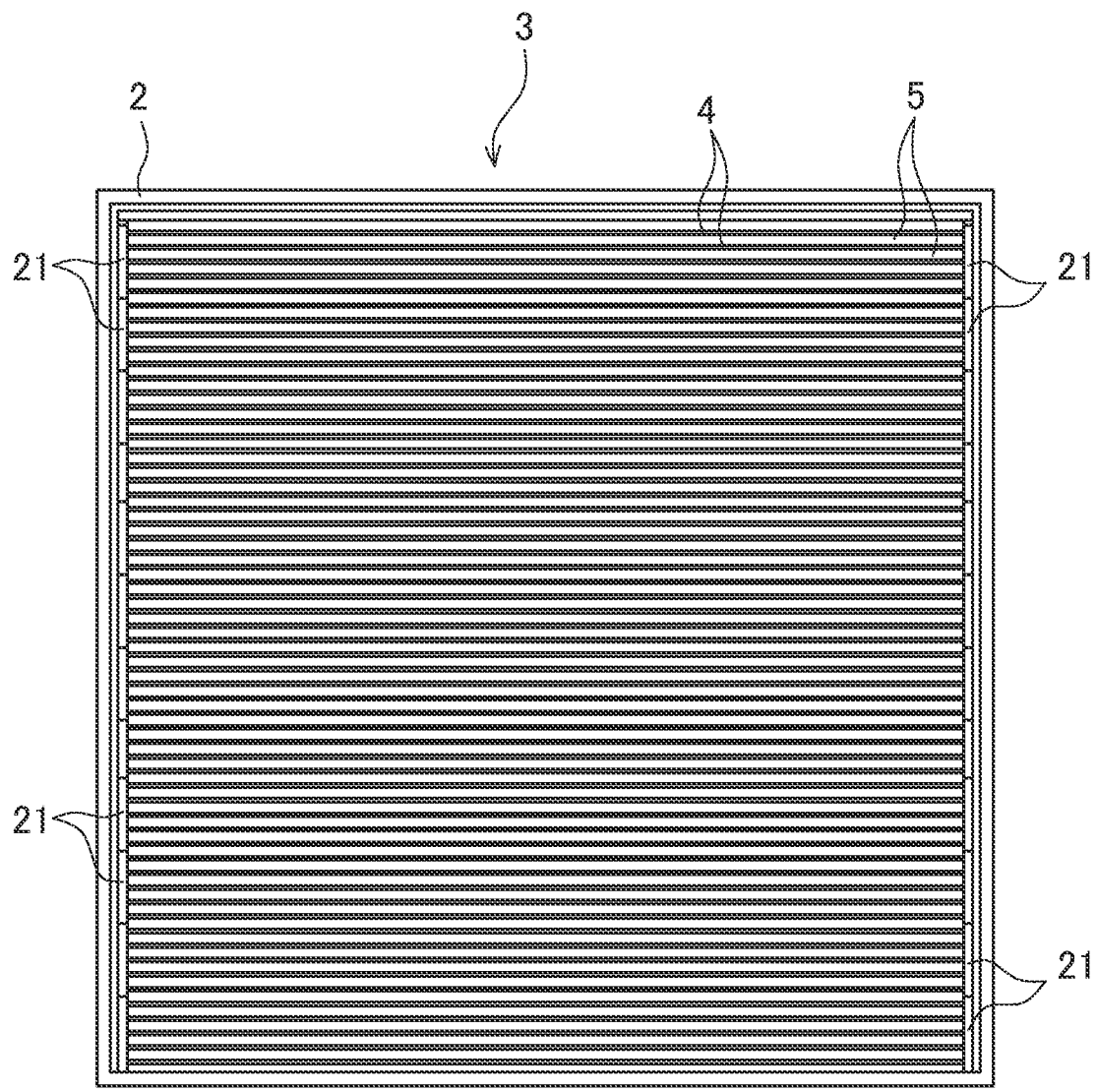
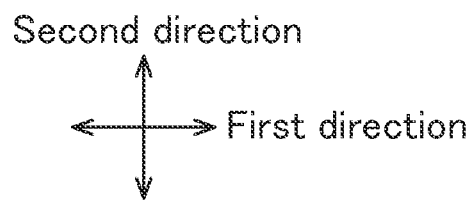

Fig.2
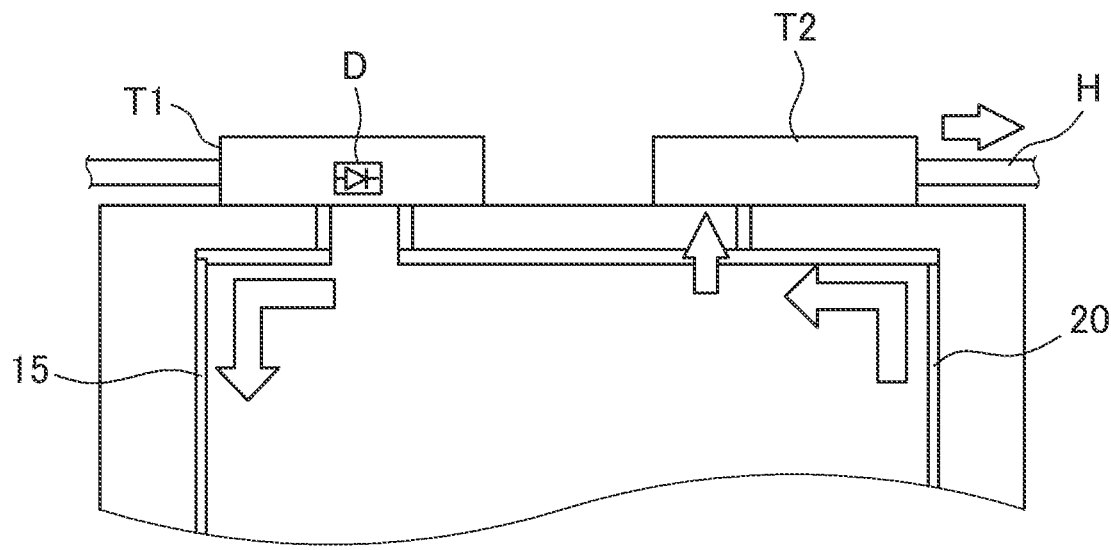
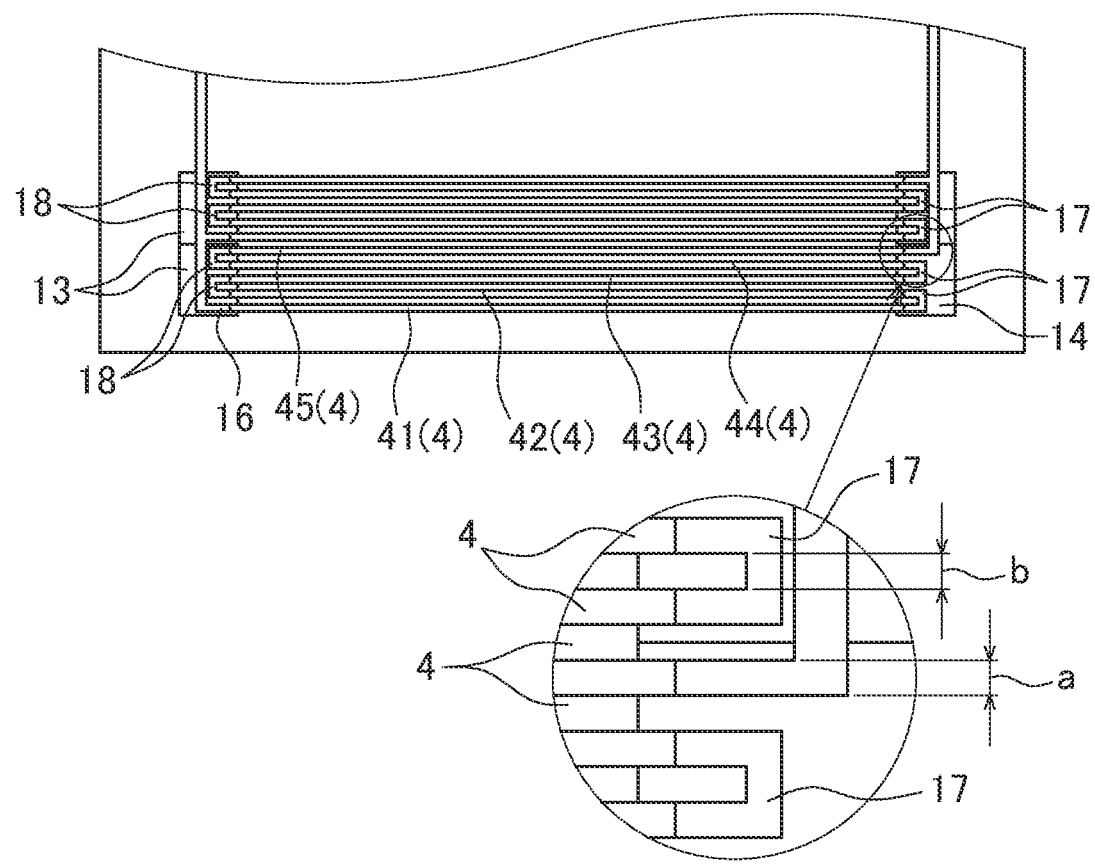

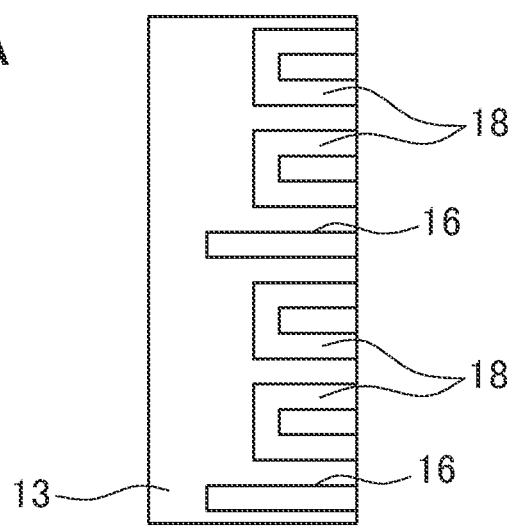
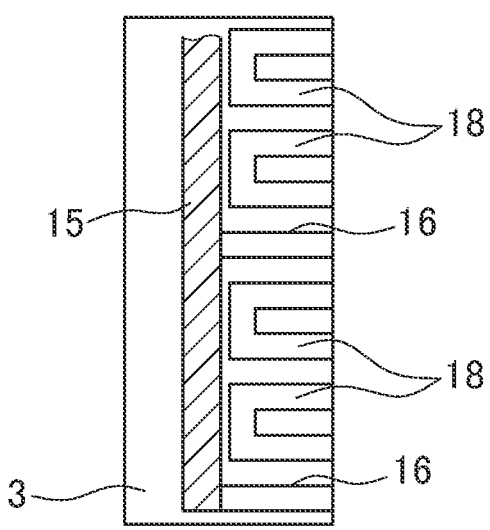
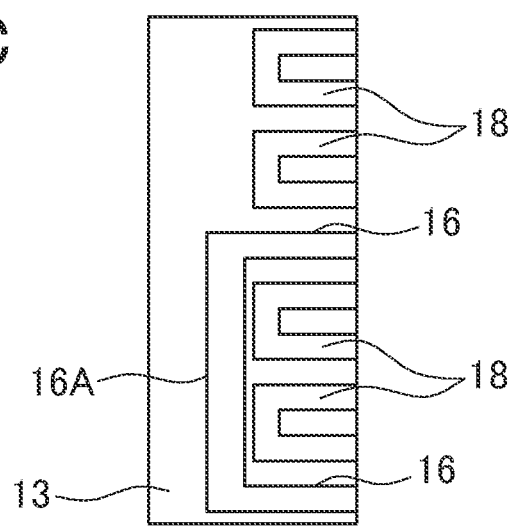

SOLAR CELL MODULE

CROSS-REFERENCE TO RELATED APPLICATION

This application claims priority to Japanese Patent Application No. 2020-070450, the disclosure of which is incorporated herein by reference in its entirety.

FIELD

The present invention relates to a see-through type solar cell module including at least three solar cell strings, each of which has a plurality of solar cells disposed in a first direction to be electrically connected to each other, the at least three solar cell strings being disposed with spaces interposed respectively therebetween in a second direction.

BACKGROUND

The solar cell module used for, for example, a glass building material is configured to let in light through the spaces respectively between the solar cell strings adjacent to each other in the second direction while the solar cell strings generate electricity. When the solar cell strings are assembled to form the solar cell module, for example, a number of solar cell strings are disposed with spaces interposed respectively therebetween in the second direction on a glass substrate disposed on a back surface, which is an opposite surface to a light receiving surface, and the same ends of each two solar cell strings adjacent to each other in the second direction are connected to each other with a wire having such a length as to extend over the two ends to thereby allow the each two solar cell strings adjacent to each other in the second direction to be electrically connected to each other (see FIG. 5 of WO 2019/172258 A).

CITATION LIST

Patent Literature

Patent Literature 1: WO 2019/172258 A

SUMMARY

Technical Problem

When the solar cell module is used for a glass building material, a solar cell string is formed of a number of long and narrow solar cells connected to each other to such a length as to extend over the substantially entire width of the glass building material, and a plurality of the long and narrow solar cell strings thus formed are disposed with spaces respectively therebetween in a vertical direction, which is the second direction, to form the solar cell module into a blind-like shape for an improved designability. Thus, not only do the number of long and narrow solar cell strings need to be disposed while being adjusted in position, but also each two solar cell strings adjacent to each other in the vertical direction need to be connected via a wire to each other with their ends kept being aligned. This assembly work is troublesome and has some room for improvement.

In view of such circumstances, it is an object of the present invention to provide a solar cell module capable of being easily assembled.

Solution to Problem

A solar cell module according to the present invention includes: at least three solar cell strings, in which each of the at least three solar cell strings is formed of a plurality of solar cells arranged in a first direction and electrically connected to each other, and is formed to have a first end and a second end along the first direction, and the at least three solar cell strings are disposed in a second direction crossing the first direction with spaces interposed respectively therebetween so as to form a light receiving surface on a front surface side; a first transparent plate disposed on the front surface side on which the light receiving surface is formed; and a second transparent plate disposed on a back surface side opposite to the front surface side, in which each of the at least three solar cell strings includes electrically connectable connectors at the first end and the second end, the solar cell module including wire members disposed at the first end and the second end so as to allow connectors at first ends of at least two solar cell strings out of the at least three solar cell strings to be electrically connected to each other, and to allow connectors at second ends thereof to be electrically connected to each other, and the solar cell module including: a first sheet member provided to allow the wire member disposed for each of the first ends to be located in a specific positional relationship with the wire member disposed for each of the second ends corresponding to the respective first ends; and a second sheet member provided to allow the wire member disposed for each of the second ends to be located in a specific positional relationship with the wire member disposed for each of the first ends corresponding to the respective second ends.

The configuration can be such that the plurality of solar cells are interconnected with each other by shingling to thereby form each of the at least three solar cell strings.

The configuration can be such that each of the wire members includes a connection part extending in the first direction.

The configuration can be such that the connection part is formed to have substantially the same width in the second direction as the width in the second direction of each of the connectors of each of the at least three solar cell strings.

BRIEF DESCRIPTION OF DRAWINGS

FIG. 1 is a front view of a glass building material formed with a solar cell module of the present invention assembled to a frame member.

FIG. 2 is a front view showing a configuration of the solar cell module.

FIG. 8A is a front view of a first sheet member and two types of wire members formed on the first sheet member according to another embodiment.

FIG. 8B is a front view showing a state where a negative side electric line is connected in each of the configurations of FIG. 8A and FIG. 8C.

FIG. 8C is a front view of a first sheet member and two wire members formed on the first sheet member according to another embodiment.

DESCRIPTION OF EMBODIMENTS

A description will be hereinafter given on a solar cell module according to one embodiment of the present invention with reference to the drawings.

FIG. 1 shows a glass building material 3 in which a see-through type solar cell module formed into a blind-like shape is assembled (internally fitted) into a frame member 2 having a rectangular outer shape (a square outer shape in FIG. 1) in front view with an opening thereinside, and having such a shape as to lack one of the four sides of the rectangular shape in cross section. This glass building material 3 is used by being assembled into an opening (not shown) formed in a building. A description will be given with the definitions that in FIG. 1, a right and left direction (transverse direction) in front view is referred to as a first direction, and a vertical direction (longitudinal direction) orthogonal to the right and left direction (transverse direction) is referred to as a second direction. In this embodiment, the second direction is a direction orthogonal to the first direction, but the second direction can be a direction crossing the first direction at an angle other than at a right angle. The first direction, which in this embodiment refers to the right and left direction, can be any direction.

Figure 3:
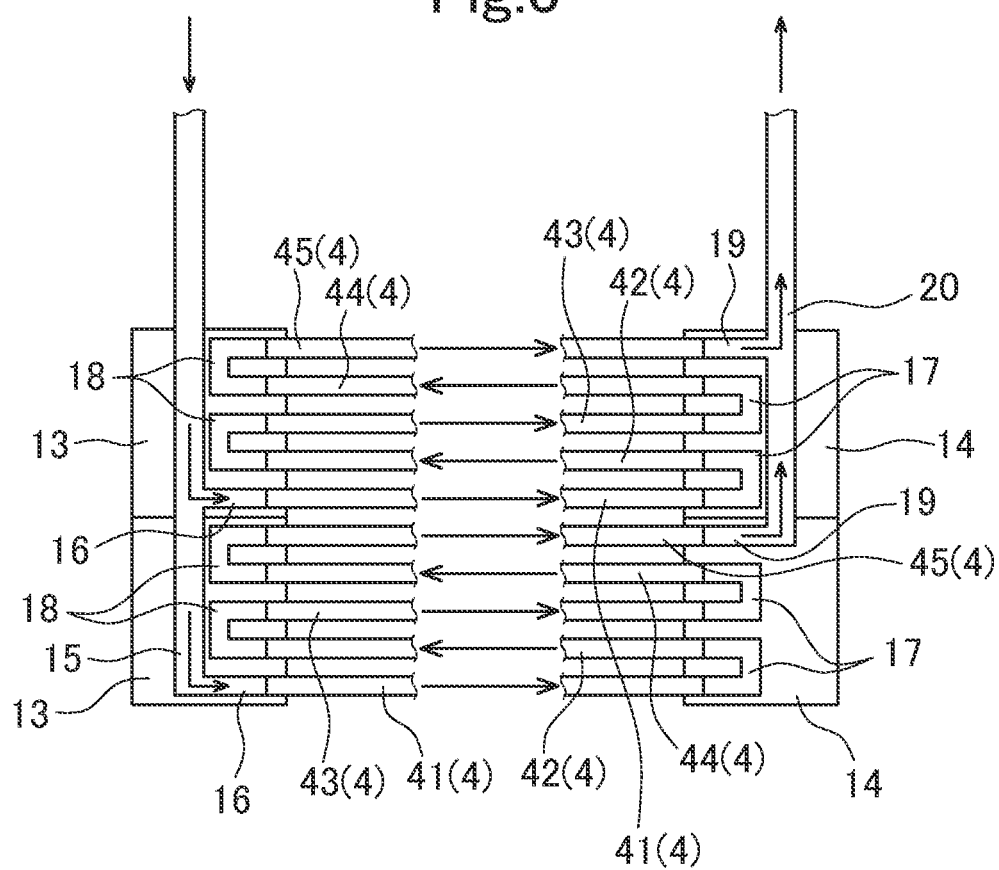
FIG. 3 is an enlarged view of a relevant part of FIG. 2.
Figure 4:
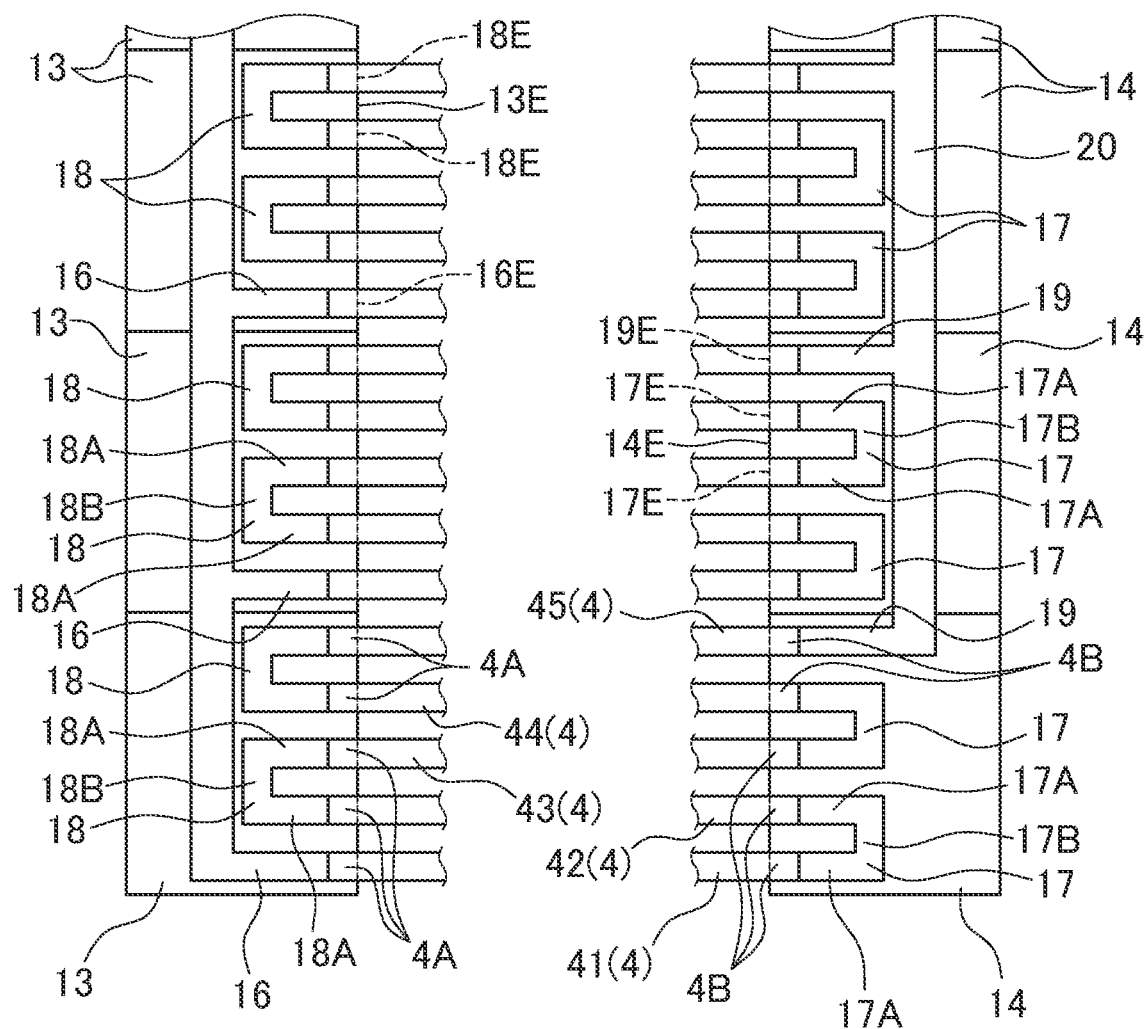
FIG. 4 is a front view of connectors of the solar cell string, and parts forming the solar cell module.

The solar cell module has an outer shape slightly smaller than the frame 2, and is formed of a plurality of solar cell strings 4 disposed along the first direction with spaces 5 interposed respectively between the solar cell strings 4 adjacent to each other in the second direction to let in light therethrough. In this embodiment, as shown in FIG. 3, five solar cell strings 4 adjacent to each other in the second direction are connected to each other in series to form a unit, and all units (two units are shown in FIG. 3) are connected to each other in parallel to form the solar cell module. As shown in FIG. 2 to FIG. 4, the cell strings 4 forming a unit include, from a lower side, a first solar cell string 41, a second solar cell string 42, a third solar cell string 43, a fourth solar cell string 44, and a fifth solar cell string 45.

Each of the solar cell strings 4 is formed of a plurality of (e.g., 60) solar cells arranged in the first direction and connected in series to the adjacent ones in the first direction of the plurality of solar cells. Each of the plurality of solar cells has a dimension a (see the enlarged view of FIG. 2) in the second direction (i.e., width) of, for example, 4 mm. Each of the spaces 5 between each two solar cell strings 4 adjacent to each other in the second direction has a dimension b (see the enlarged view of FIG. 2) of 4 mm, which is the same as the dimension in the second direction (i.e., width) of the solar cell.

Figure 5:
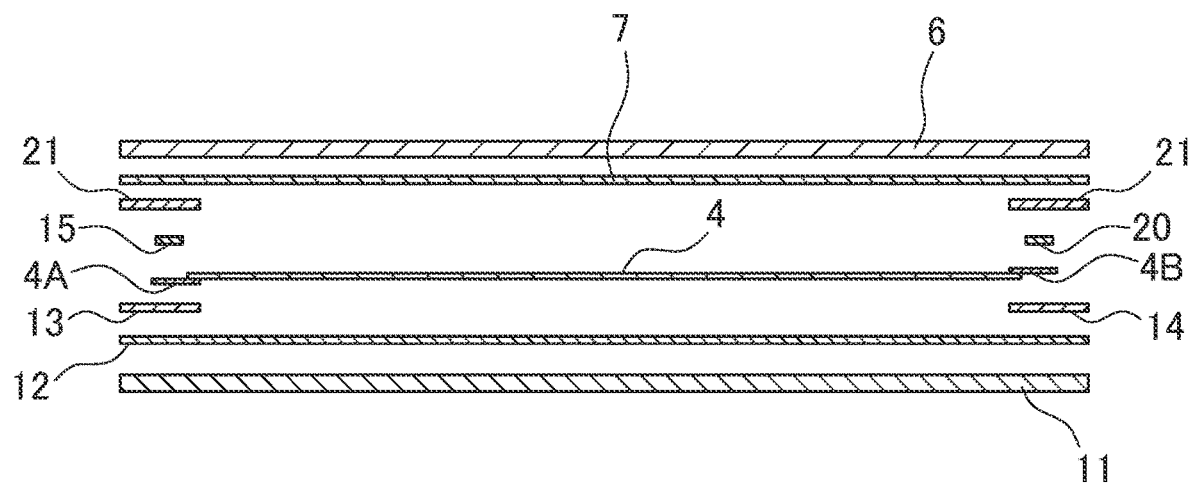
FIG. 5 is an exploded view of the parts forming the solar cell module.

As shown in FIG. 5, a high transmission (float) non-tempered glass 6 as a first transparent plate, and a transparent solar cell exclusive sealing member (hereinafter referred to as first sealing member) 7 having substantially the same size as the high transmission (float) non-tempered glass 6 are disposed from a front side of the solar cell module on which a light receiving surface is provided, while a high transmission (float) non-tempered glass 11 as a second transparent plate, and a transparent solar cell exclusive sealing member (hereinafter referred to as second sealing member) 12 having substantially the same size as the high transmission (float) non-tempered glass 11 are disposed from a back side opposite to the light receiving surface of the solar cell module. The plurality of solar cell strings 4 are disposed between the first sealing member 7 on the upper side and the second sealing member 12 on the lower side. The first sealing member 7 and the second sealing member 12 are formed from the same resin material, examples of which include EVA, PO (polyolefin), PVB (polyvinyl butyral), and ionomers.

A first end and a second end (the left and right ends in the figures), which are both ends in the first direction of each of the plurality of solar cell strings 4, respectively include connectors 4A, 4B (see FIG. 4 and FIG. 5) linearly extending on outer sides in the first direction. As shown in FIG. 4 and FIG. 5, the connectors 4A, 4B are connected to first to fourth wire members 16 to 19, which are positioned and fixed on wiring sheet members 13, 14 (present on the left and right sides in the figures) disposed on the front surface of both ends in the first direction of the back side second sealing member 12.

As shown in FIG. 3 and FIG. 4, a first wire member 16 electrically connected to a negative side electric line 15, which is a first wire to which a negative electrode is connected, and a vertically disposed pair of third wire members 18 to which the connectors 4A of left ends (first ends) of four solar cell strings 4 arranged in the second direction are connected are provided on the wiring sheet member (hereinafter referred to as first sheet member) 13 located on the left side of the figures. A vertically disposed pair of second wire members 17 to which the connectors 4B of right ends (second ends) of four solar cell strings 4 arranged in the second direction are connected, and a fourth wire member 19 electrically connected to a positive side electric line 20, which is a second wire to which a positive electrode is connected are provided on the wiring sheet member (hereinafter referred to as second sheet member) 14 located on the right side of the figures.

The first wire member 16 and the fourth wire member 19 are made of a conductive metal, and have the same rectangular shape linearly extending in the first direction. The first wire member 16 and the second wire member 19 have their short sides formed to have substantially the same dimension (width) as the dimension (width) in the second direction of each of the connectors 4A, 4B of the solar cell string 4. The first wire member 16 is positioned and fixed at a lower part of the first sheet member 13 so as to lie along the first direction, and the fourth wire member 19 is positioned and fixed at an upper part of the second sheet member 14 so as to lie along the first direction. As shown in FIG. 4, an inner end 16E of the first wire member 16 and an inner end 19E of the fourth wire member 19 coincide respectively with an inner end 13E of the first sheet member 13 and an inner end 14E of the second sheet member 14.

The second wire members 17 and the third wire members 18 share the same shape, and each of the second wire members 17 and the third wire members 18 includes: a vertical pair of connection parts 17A, 18A formed into a transversely elongated rectangular shape linearly extending in the first direction; and a coupling part 17B, 18B formed into a linear and longitudinally elongated rectangular shape and coupling outer sides in the right and left direction of the vertical pair of connection parts 17A, 18A to each other in the vertical direction. The lower one of the third wire members 18 is positioned and fixed on the first sheet member 13 with a specific clearance above the first wire member 16, and the upper one of the third wire members 18 located above the lower one of the third wire members 18 is positioned and fixed on the first sheet member 13. The upper one of the second wire members 17 is positioned and fixed on the second sheet member 14 with a specific clearance below the fourth wiring member 19, and the lower one of the second wire members 17 located below the upper one of the second wire members 17 is positioned and fixed on the second sheet member 14.

As shown in FIG. 4, inner ends 17E of the pair of connection parts 17A of each of the pair of second wire members 17, and inner ends 18E of the pair of connection parts 18A of each of the pair of third wire members 18 coincide respectively with the inner end of the second sheet member 14 and the inner end of the first sheet member 13. With this configuration, the solar cell strings 4 placed at the respective positions of the wire members 16 to 19 can be connected to the wire members 16 to 19 simply by connecting the connectors 4A, 4B of the solar cell strings 4 to the respective pair of connection parts 17A, 18A extending in the first direction while the orientations of the solar cell strings 4 are aligned. Soldering, bonding with a conductive adhesive, adhesion with a conductive film, or the like is to be used to connect the connectors 4A, 4B of the solar cell strings 4 to the wire members 16 to 19.

Each of the pair of connection parts 17A, 18A is formed to have substantially the same width in the second direction as the width in the second direction of the connector 4A, 4B of each of the solar cell strings 4. With this configuration, the solar cell strings 4 placed at the respective positions of the wire members 16 to 19 can be connected to the wire members 16 to 19 simply by connecting the connectors 4A, 4B of the solar cell strings 4 to the pair of connection parts 17A, 18A in a state where the connectors 4A, 4B are placed to coincide in position with the respective pair of connection parts 17A, 18A.

The first wire member 16 and the third wire members 18 are provided on the first sheet member 13 fixed to one end in the first direction of the front surface of the second sealing member 12, so as to have a specific positional relationship with the second wire members 17 and the fourth wire member 19. The second wire members 17 and the fourth wire member 19 are provided on the second sheet member 14 fixed to the other end in the first direction of the front surface of the second sealing member 12, so as to have a specific positional relationship with the first wire member 16 and the third wire members 18.

As shown in FIG. 4, the specific positional relationship refers to a relationship in which the first wire member 16 is positioned to be opposed in the first direction to, or positioned to coincide in the second direction with the lower one of the pair of connection parts 17A of the second wire member 17 located on the lower side of the second sheet member 14. Further, the specific positional relationship refers to a relationship in which the lower one of the pair of connection parts 18A of the third wire member 18 located on the lower side of the first sheet member 13 is opposed in the first direction to, or positioned to coincide in the second direction with the upper one of the pair of connection parts 17A of the second wire member 17 located on the lower side of the second sheet member 14. Still further, the specific positional relationship refers to a relationship in which the upper one of the pair of connection parts 18A of the third wire member 18 located on the lower side of the first sheet member 13 is opposed in the first direction to, or positioned to coincide in the second direction with the lower one of the pair of connection parts 17A of the second wire member 17 located on the upper side of the second sheet member 14. Yet further, the specific positional relationship refers to a relationship in which the lower one of the pair of connection parts 18A of the third wire member 18 located on the upper side of the first sheet member 13 is opposed in the first direction to, or positioned to coincide in the second direction with the upper one of the pair of connection parts 17A of the second wire member 17 located on the upper side of the second sheet member 14. Still further, the specific positional relationship refers to a relationship in which the upper one of the pair of connection parts 18A of the third wire member 18 located on the upper side of the first sheet member 13 is opposed in the first direction to, or positioned to coincide in the second direction with the fourth wire member 19. Examples of the method for forming the first wire member 16 to the fourth wire member 19 on the first sheet member 13 and the second sheet member 14 include screen printing using a conductive paste or plating using copper plating.

As shown in FIG. 2, the negative side electric line 15 is drawn into a negative side terminal box T1 disposed on the left side of the upper end, and a bypass diode D configured to block electric current from flowing back is provided in the negative side terminal box T1. The positive side electric line 20 is drawn into a positive side terminal box T2 disposed on the right side of the upper end, and is connected to a power extraction line H for extracting power.

The first sheet member 13 and the second sheet member 14 share the same configuration, are formed into a vertically elongated rectangular shape as shown in FIG. 4, are formed of PI (polyimide), PET (polyethylene terephthalate), or the like, and are formed to have a black color. Wire shielding members 21 (see FIG. 1 and FIG. 5) each formed into a vertically elongated rectangular shape and having the same size as each of the first sheet member 13 and the second sheet member 14 are disposed to respectively cover the first sheet member 13 and the second sheet member 14. The wire shielding members 21 are formed of PET (polyethylene terephthalate) or the like, and are formed to have a black color.

The first solar cell string 41 to the fifth solar cell string 45 configured as above can be disposed in a specific posture simply by being connected to the first wire member 16 to the fourth wire member 19 provided on the first sheet member 13 and the second sheet member 14 in a specific positional relationship. This configuration can eliminate the work that a plurality of particularly long and narrow solar cell strings are disposed while being placed at specific positions, and the work that the ends of the solar cell strings adjacent to each other are connected to each other by wires.

Figure 6:
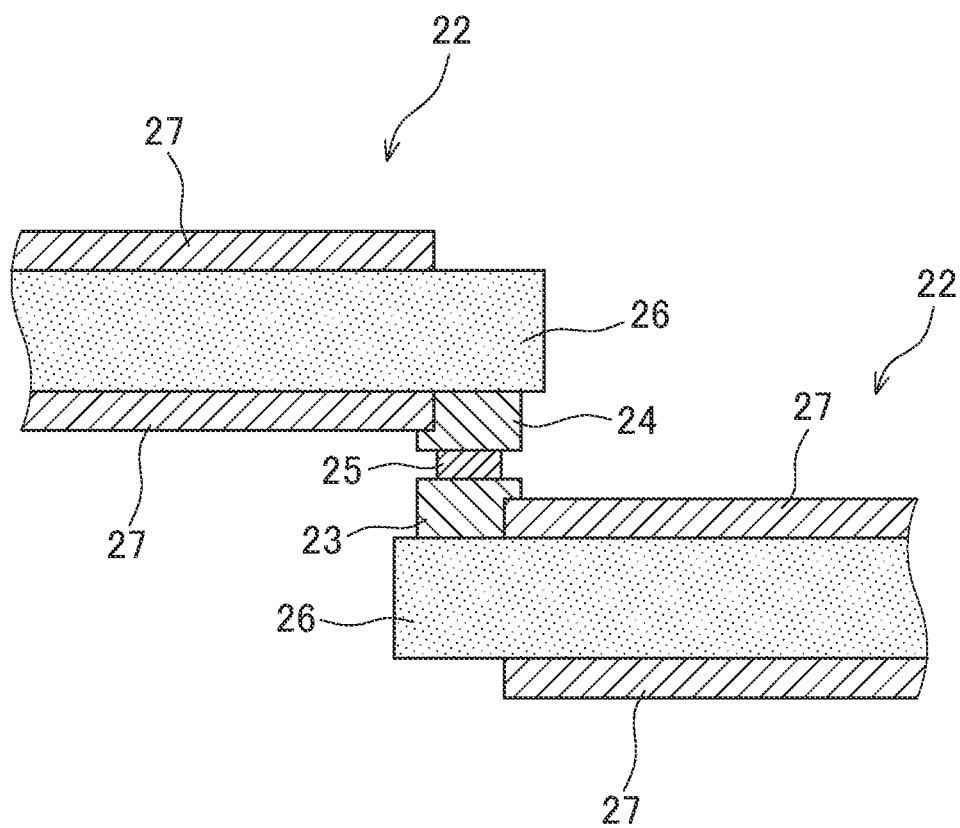
FIG. 6 is a sectional view of the solar cell string formed by interconnection by shingling.

FIG. 6 shows how the plurality of solar cells 22 are arranged to form each of the solar cell strings 4 in this embodiment. That is, the arrangement is made such that a back side bus bar electrode 24 included in the solar cell 22 located on the upper side in FIG. 6 is disposed to overlap a bus bar electrode 23 included in the solar cell 22 located on the lower side in FIG. 6, and the portions of the solar cells 22 in which the bus bars 23, 24 overlap each other are electrically connected to each other via a conductive member 25 (the connection of the plurality of solar cells 22 in such a way is referred to as "interconnection by shingling"). The hatched portions on and under each of semiconductor substrates 26 in FIG. 6 represent finger lines 27 formed on the front surface and the back surface of the semiconductor substrate 26. Such an arrangement allows the plurality of solar cells 22 to be connected to each other in series to form a solar cell string 4. The configuration capable of electrical connection between the solar cells only by interconnecting the plurality of solar cells 22 with each other by shingling allows a solar cell string 4 to be easily formed.

It is a matter of course that the present invention is not limited to the aforementioned embodiment, and various modifications can be made without departing from the gist of the present invention.

Figure 7A:
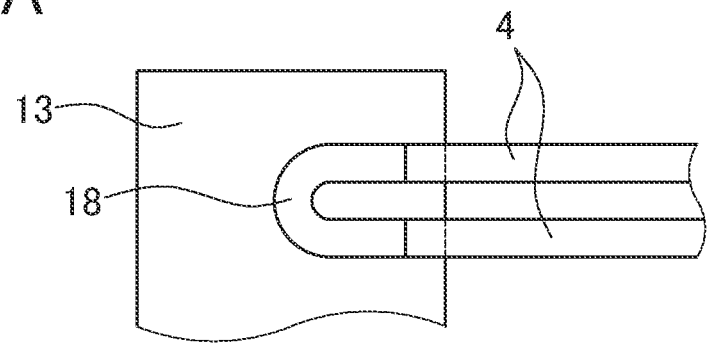
FIG. 7A is a front view of a wire member connecting the same ends of each two solar cell strings adjacent to each other in the second direction according to another embodiment.
Figure 7B:
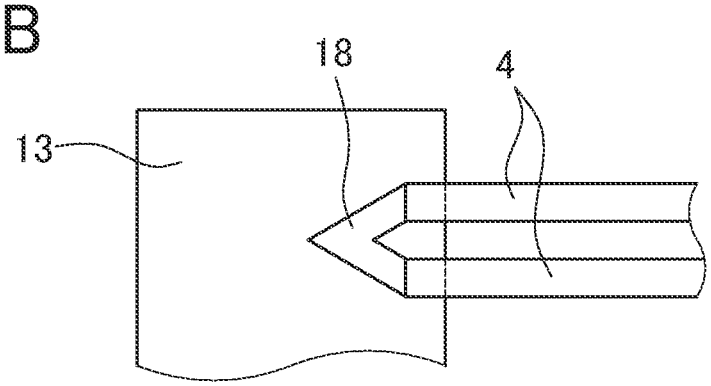
FIG. 7B is a front view of a wire member connecting the same ends of each two solar cell strings adjacent to each other in the second direction according to another embodiment.
Figure 7C:
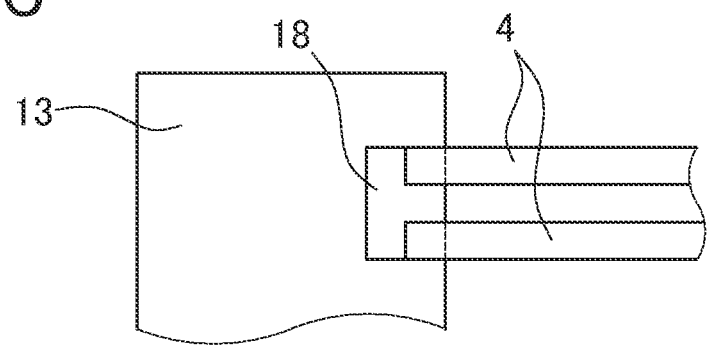
FIG. 7C is a front view of a wire member connecting the same ends of each two solar cell strings adjacent to each other in the second direction according to another embodiment.

The aforementioned embodiment has been described by taking, for example, the case where the second wire member 17 (or the third wire member 18) is formed into a rectangular shape with one of the four sides thereof missing in cross section, but as shown in, for example, FIG. 7A, the third wire member 18 (and the second wire member 17 as well although not shown) can be formed to have a U-shape. Further, as shown in, for example, FIG. 7B, the third wire member 18 (and the second wire member 17 as well although not shown) can be formed to have substantially a V-shape. Still further, as shown in, for example, FIG. 7C, the third wire member 18 (and the second wire member 17 as well although not shown) can be formed to have a rectangular shape elongated in the second direction (vertical direction).

The aforementioned embodiment has been described by taking, for example, the case where five solar cell strings forming the solar cell module are disposed with specific spaces interposed respectively therebetween in the second direction, and the connectors on both sides of the five solar cell strings are connected to the respective wire members on the first sheet member 13 and the second sheet member 14, but the configuration can be such that a give number of, such as three, four, or six or more solar cell strings are disposed with specific spaces interposed respectively therebetween. For example, FIG. 8A shows the first sheet member 13 including two first wire members 16 and four third wire members 18 to allow ten solar cell strings to be connected thereto. Specifically, from the lower end to the upper end of the first sheet member 13, the first wire member 16, the third wire member 18, the third wire member 18, the first wire member 16, the third wire member 18, and the third wire member 18 are disposed in this order. All of these wire members 16, 18 are made of copper foil. Although not shown, the second sheet member 14 is disposed in the solar cell module in a state obtained by turning the first sheet member 13 of FIG. 8A 180° upside down. FIG. 8B shows a state where the negative side electric line 15 (diagonally hatched portion) made of a solder plated copper wire is connected to the first wire members 16 located on the upper and lower sides. FIG. 8C shows a case where the first sheet member 13 includes a coupling part 16A that electrically couples one sides of the first wire members 16 located on the upper and lower sides. The first wire members 16, the coupling part 16A, and the four third wire members 18 are made of copper foil. Although not shown, the second sheet member 14 is disposed in the solar cell module in a state obtained by turning the first sheet member 13 of FIG. 8C 180° upside down. Similar to FIG. 8A, FIG. 8B shows a state where the negative side electric line 15 (diagonally hatched portion) made of a solder plated copper wire is connected across the first wire members 16 located on the upper and lower sides.

Figure 9A:
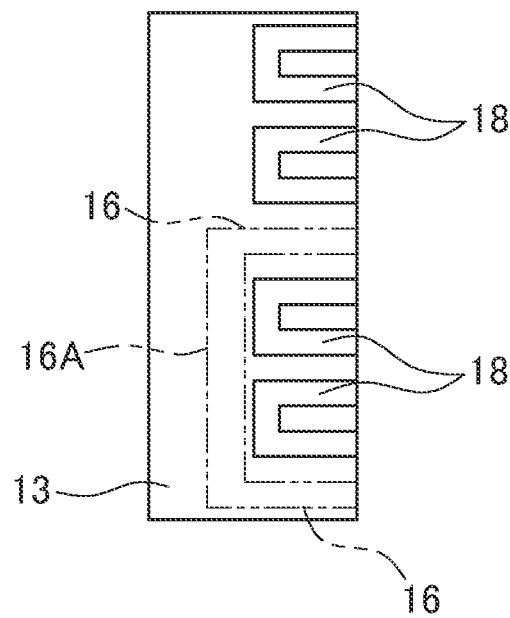
FIG. 9A is a front view of a first sheet member and wire members formed on the first sheet member according to still another embodiment.
Figure 9B:
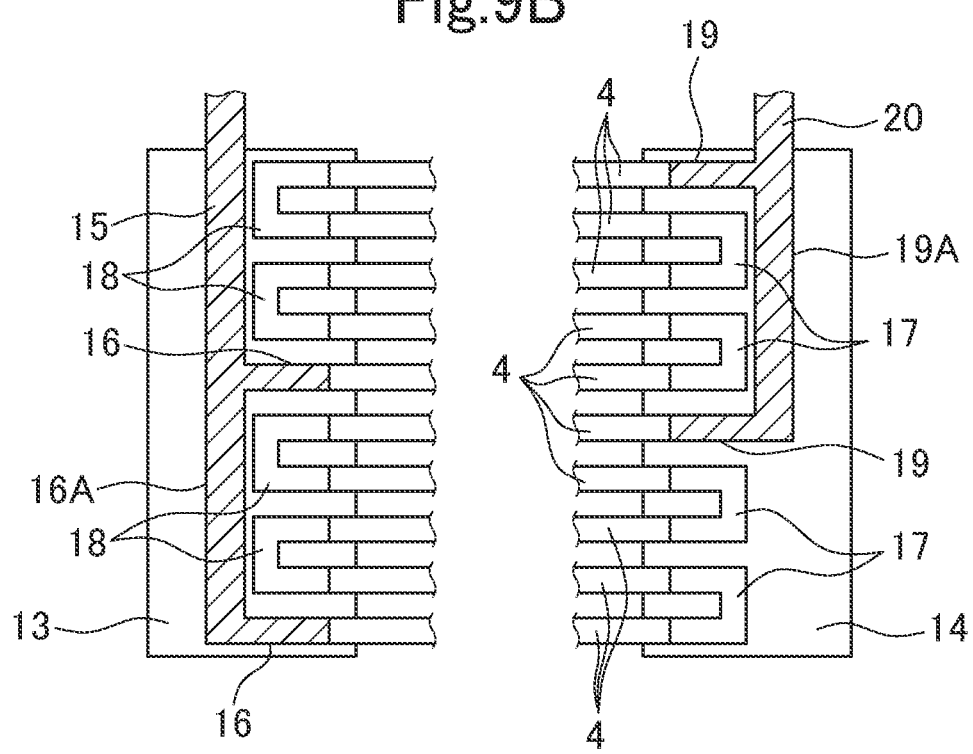
FIG. 9B is a front view showing a state where a negative side electric line is connected to the wire members of FIG. 9A while a positive side electric line is connected to a second sheet member.

FIG. 9A shows a state where the first wire members 16 located on the upper and lower sides and the coupling part 16A shown in FIG. 8C are not formed (the state shown by two-dot chain line). That is, it shows the state where only the four third wire members 18 made of copper foil are formed. In FIG. 9B, the first wire members 16, the coupling part 16A, and the negative side electric line 15 on the first sheet member 13 are formed of a solder plated copper wire (diagonally hatched portion). Likewise, four second wire members 17 and the fourth wire members 19, which are made of copper foil, and a coupling part 19A that couples one ends of the fourth wire members 19 are formed on the second sheet member 14, and the fourth wire members 19, the coupling part 19A, and the positive side electric line 20 are formed of a solder plated copper wire (diagonally hatched portion). FIG. 9B shows a state where first ends of ten solar cell strings 4 are connected respectively to the first wire members 16 and the third wire members 18 on the first sheet member 13, and second ends of the ten solar cell strings 4 are connected respectively to the second wire members 17 and the fourth wire members 19 on the second sheet member 14. The hatched portions in FIG. 9B are formed of the solder plated copper wire. Since the hatched portions shown in FIG. 8B and FIG. 9B are formed of the solder plated copper wire as described above, their resistance can be made smaller than the case where they are made of copper foil to thereby enable large electric current to flow for power collection.

The aforementioned embodiment has been described by taking, for example, the case where a solar cell string 4 is formed by interconnecting the plurality of solar cells with each other by shingling, but a solar cell string 4 can be formed by other connection methods including a general connection method.

In the aforementioned embodiment, the second direction serves as a direction orthogonal to the first direction, but can be a direction crossing the first direction at an angle other than at a right angle.

The configurations and operational effects in relation to the aforementioned embodiment are summarized below. A solar cell module according to the aforementioned embodiment includes: at least three solar cell strings 41 to 43, in which each of the at least three solar cell strings 41 to 43 is formed of a plurality of solar cells arranged in a first direction and electrically connected to each other, and is formed to have a first end and a second end along the first direction, and the at least three solar cell strings 41 to 43 are disposed in a second direction crossing the first direction with spaces interposed respectively therebetween so as to form a light receiving surface on a front surface side; a first transparent plate 6 disposed on the front surface side on which the light receiving surface is formed; and a second transparent plate 11 disposed on a back surface side opposite to the front surface side, in which each of the at least three solar cell strings 41 to 43 includes electrically connectable connectors 4A, 4B at the first end and the second end, the solar cell module including wire members 16 to 18 disposed at the first end and the second end so as to allow connectors 4A at first ends of at least two solar cell strings out of the at least three solar cell strings 41 to 43 to be electrically connected to each other, and to allow connectors 4B at second ends thereof to be electrically connected to each other, and the solar cell module including: a first sheet member 13 provided to allow the wire member 16, 18 disposed for each of the first ends to be located in a specific positional relationship with the wire member 17 disposed for each of the second ends corresponding to the respective first ends; and a second sheet member 14 provided to allow the wire member 17 disposed for each of the second ends to be located in a specific positional relationship with the wire member 16, 18 disposed for each of the first ends corresponding to the respective second ends.

According to such a configuration, the at least two solar cell strings out of the at least three solar cell strings 41 to 43 can be disposed in a specific posture simply by connecting the connectors 4A, 4B of the first end and the second end of the each of at least two solar cell strings to the respective wire members 16 to 18 provided on the first sheet member 13 and the second sheet member 14 in a specific positional relationship. This configuration can eliminate the work that a plurality of solar cell strings are disposed while being placed at specific positions, and the work that the ends of the solar cell strings adjacent to each other are connected to each other by wires.

The configuration can be such that the plurality of solar cells are interconnected with each other by shingling to thereby form each of the at least three solar cell strings 41 to 43.

The above configuration capable of electrical connection between the solar cells only by interconnecting the plurality of solar cells with each other by shingling allows a solar cell string to be easily formed.

The configuration can be such that each of the wire members 16 to 18 includes a connection part 17A, 18A extending in the first direction.

According to the above configuration, the solar cell strings 41 to 43 placed at the respective positions of the wire members 16 to 18 can be connected to the wire members 16 to 18 simply by connecting each of the connectors 4A, 4B of each of the solar cell strings 41 to 43 to the connection part 17A, 18A extending in the first direction while the orientations of the connectors 4A, 4B are aligned.

The configuration can be such that the connection part 17A, 18A is formed to have substantially the same width in the second direction as the width in the second direction of each of the connectors 4A, 4B of each of the at least three solar cell strings 41 to 43.

According to the above configuration, the solar cell strings 41 to 43 placed at the respective positions of the wire members 16 to 18 can be connected to the wire members 16 to 18 simply by connecting each of the connectors 4A, 4B of each of the solar cell strings 41 to 43 to the connection part 17A, 18A in a state where each of the connectors 4A, 4B is placed to coincide in position with the connection part 17A, 18A.

As described above, according to the aforementioned embodiment, at least two solar cell strings can be disposed in a specific posture simply by connecting the connectors 4A, 4B at both ends of each of the at least two solar cell strings to the respective wire members 16 to 18 provided on the first sheet member 13 and the second sheet member 14 in a specific positional relationship. Thus, a solar cell module capable of being easily assembled can be provided.

REFERENCE SIGNS LIST

2: Frame member
3: Glass building material
4: Solar cell string
4A, 4B: Connector
5: Space
6: High transmission (float) non-tempered glass (first transparent plate)
7: First sealing member
11: High transmission (float) non-tempered glass (second transparent plate)
12: Second sealing member
13: Wiring sheet member (first sheet member)
14: Wiring sheet member (second sheet member)
15: Negative side electric line
16: First wire member
16A: Coupling part
17: Second wire member
18: Third wire member
19: Fourth wire member
19A: Coupling part
17A, 18A: Connection part
17B, 18B: Coupling part
20: Positive side electric line
21: Wire shielding member
22: Solar cell
23: Bus bar electrode
24: Back side bus bar electrode
25: Conductive member
26: Semiconductor substrate
27: Finger line
41: First solar cell string
42: Second solar cell string
43: Third solar cell string
D: Bus bar diode
H: Power extraction line
T1: Negative side terminal box
T2: Positive side terminal box

The invention claimed is:
1. A solar cell module comprising:
at least three solar cell strings, wherein each of the at least three solar cell strings is formed of a plurality of solar cells arranged in a first direction and electrically connected to each other, and is formed to have a first end and a second end along the first direction, and the at least three solar cell strings are disposed in a second direction crossing the first direction with spaces interposed respectively therebetween so as to form a light receiving surface on a front surface side;
a first transparent plate disposed on the front surface side on which the light receiving surface is formed; and
a second transparent plate disposed on a back surface side opposite to the front surface side, wherein
each of the at least three solar cell strings comprises electrically connectable connectors at the first end and the second end,
the solar cell module comprising wire members disposed at the first end and the second end of each of the at least three solar cell strings so as to allow the connectors at first ends of at least two solar cell strings out of the at least three solar cell strings to be electrically connected to each other, and to allow the connectors at second ends of at least two solar cell strings of the at least three solar cell strings to be electrically connected to each other, and
the solar cell module comprising: a first sheet member provided to allow a wire member of the wire members disposed at the first end of each of the at least three solar cell strings to be located in a specific positional relationship with respect to a wire member of the wire members disposed at the second end of each of the at least three solar cell strings; and a second sheet member provided to allow the wire member disposed at the second end of each of the at least three solar cell strings to be located in a specific positional relationship with respect to the wire member disposed at the first end of each of at least three solar cell strings, wherein the first sheet member comprises thereon: a first wire member of the wire members for being connected to a negative side electric line of the solar cell module; and a plurality of third wire members of the wire members for being connected to the connectors at the first ends of the at least three solar cell strings, the second sheet member comprises thereon: a plurality of second wire members of the wire members for being connected to the connectors at the second ends of the at least three solar cell strings; and a fourth wire member of the wire members for being connected to a positive side electric line of the solar cell module, the first sheet member and the second sheet member share the same shape, the first wire member and the fourth wire member share the same shape and are disposed to positionally coincide with each other respectively on the first sheet member and the second sheet member, and the plurality of second wire members and the plurality of third wire members share the same shape and are disposed to positionally coincide with each other respectively on the first sheet member and the second sheet member.

2. The solar cell module according to claim 1, wherein the plurality of solar cells are interconnected with each other by shingling to thereby form each of the at least three solar cell strings.

3. The solar cell module according to claim 1, wherein each of the wire members comprises a connection part extending in the first direction.

4. The solar cell module according to claim 3, wherein the connection part is formed to have substantially the same width in the second direction as the width in the second direction of each of the connectors of each of the at least three solar cell strings.

5. The solar cell module according to claim 2, wherein each of the wire members comprises a connection part extending in the first direction.

6. The solar cell module according to claim 5, wherein the connection part is formed to have substantially the same width in the second direction as the width in the second direction of each of the connectors of each of the at least three solar cell strings.

* * * * *